(12) United States Patent
Chow et al.

(10) Patent No.: US 8,050,047 B2
(45) Date of Patent: Nov. 1, 2011

(54) INTEGRATED CIRCUIT PACKAGE SYSTEM WITH FLEXIBLE SUBSTRATE AND RECESSED PACKAGE

(75) Inventors: Seng Guan Chow, Singapore (SG); Il Kwon Shim, Singapore (SG); Byung Joon Han, Singapore (SG); Kambhampati Ramakrishna, Chandler, AZ (US)

(73) Assignee: Stats Chippac Ltd., Singapore (SG)

( * ) Notice: Subject to any disclaimer, the term of this patent is extended or adjusted under 35 U.S.C. 154(b) by 718 days.

(21) Appl. No.: 12/136,002

(22) Filed: Jun. 9, 2008

(65) Prior Publication Data
US 2009/0016032 A1    Jan. 15, 2009

Related U.S. Application Data

(60) Provisional application No. 60/949,513, filed on Jul. 12, 2007.

(51) Int. Cl.
H05K 1/16    (2006.01)
H05K 1/00    (2006.01)
H01L 23/02    (2006.01)

(52) U.S. Cl. ........ 361/765; 361/749; 361/760; 361/767; 361/770; 361/772; 174/254; 174/255; 257/684; 257/686

(58) Field of Classification Search .......................... None
See application file for complete search history.

(56) References Cited

U.S. PATENT DOCUMENTS

| | | | |
|---|---|---|---|
| 6,683,377 B1 | 1/2004 | Shim et al. | |
| 6,765,288 B2 * | 7/2004 | Damberg | 257/698 |
| 6,841,855 B2 | 1/2005 | Jaeck et al. | |
| 6,869,825 B2 * | 3/2005 | Chiu | 438/106 |
| 6,924,551 B2 * | 8/2005 | Rumer et al. | 257/688 |
| 6,933,598 B2 * | 8/2005 | Karnezos | 257/686 |
| 6,940,729 B2 * | 9/2005 | Cady et al. | 361/767 |
| 7,033,911 B2 * | 4/2006 | Manepalli et al. | 438/455 |
| 7,053,478 B2 | 5/2006 | Roper et al. | |
| 7,149,095 B2 * | 12/2006 | Warner et al. | 361/803 |
| 7,154,171 B1 | 12/2006 | Yoshida | |
| 7,154,175 B2 * | 12/2006 | Shrivastava et al. | 257/723 |
| 7,183,140 B2 * | 2/2007 | Davison et al. | 438/122 |
| 7,205,647 B2 | 4/2007 | Karnezos | |
| 7,235,870 B2 * | 6/2007 | Punzalan et al. | 257/685 |
| 7,358,444 B2 * | 4/2008 | Nickerson et al. | 174/254 |
| 7,485,951 B2 * | 2/2009 | Roper et al. | 257/668 |
| 7,935,569 B2 * | 5/2011 | Bang et al. | 438/107 |
| 2006/0033217 A1 * | 2/2006 | Taggart et al. | 257/778 |
| 2006/0138630 A1 * | 6/2006 | Bhakta | 257/686 |
| 2007/0187826 A1 | 8/2007 | Shim et al. | |
| 2007/0194423 A1 | 8/2007 | Yim et al. | |
| 2009/0016033 A1 | 1/2009 | Chow et al. | |
| 2009/0236753 A1 | 9/2009 | Moon et al. | |

* cited by examiner

*Primary Examiner* — Boris L Chervinsky
(74) *Attorney, Agent, or Firm* — Mikio Ishimaru (57) ABSTRACT

An integrated circuit package system includes: providing a flexible circuit substrate having a fold; mounting an integrated circuit or an integrated circuit package over the flexible circuit substrate and connected to the flexible circuit substrate with interconnects; and encapsulating the integrated circuit or integrated circuit package with a recessed encapsulation having a first level and a second level, the second level having the flexible circuit substrate folded thereover.

20 Claims, 8 Drawing Sheets

INTEGRATED CIRCUIT PACKAGE SYSTEM WITH FLEXIBLE SUBSTRATE AND RECESSED PACKAGE

CROSS-REFERENCE TO RELATED APPLICATION(S)

This application claims the benefit of U.S. Provisional Patent Application Ser. No. 60/949,513 filed on Jul. 12, 2007, and the subject matter thereof is hereby incorporated herein by reference thereto.

The present application contains subject matter related to a concurrently filed U.S. patent application by Seng Guan Chow, Il Kwon Shim, Byung Joon Han, and Kambhampati Ramakrishna entitled "INTEGRATED CIRCUIT PACKAGE SYSTEM WITH FLEXIBLE SUBSTRATE AND MOUNDED PACKAGE". The related application is assigned to STATS ChipPAC Ltd. and is identified by 12/136,007.

TECHNICAL FIELD

The present invention relates generally to integrated circuits, and more particularly to an integrated circuit package system employing multi-package module techniques.

BACKGROUND ART

The rapidly growing portable electronics market, e.g. cellular phones, laptop computers, and PDAs, are an integral facet of modern life. The multitude of portable devices represents one of the largest potential market opportunities for next generation packaging. These devices have unique attributes, which have significant impacts on manufacturing integration, in that they must be generally small, lightweight, and rich in functionality and they must be produced in high volumes at relatively low cost.

As an extension of the semiconductor industry, the electronics packaging industry has witnessed ever-increasing commercial competitive pressures, along with growing consumer expectations and the diminishing opportunities for meaningful product differentiation in the marketplace.

Packaging, materials engineering, and development are at the very core of these next generation electronics insertion strategies outlined in road maps for development of next generation products. Future electronic systems may be more intelligent, have higher density, use less power, operate at higher speed, and may include mixed technology devices and assembly structures at lower cost than today.

Current packaging suppliers are struggling to accommodate the high-speed computer devices that are projected to exceed one TeraHertz (THz) in the near future. The current technologies, materials, equipment, and structures offer challenges to the basic assembly of these new devices while still not adequately addressing cooling and reliability concerns.

The envelope of technical capability of next level interconnect assemblies are not yet known, and no clear cost effective technology has yet been identified. Beyond the performance requirements of next generation devices, the industry now demands that cost be a primary product differentiator in an attempt to meet profit goals.

As a result, the road maps are driving electronics packaging to precision, ultra miniature form factors, which require automation in order to achieve acceptable yield. These challenges demand not only automation of manufacturing, but also the automation of data flow and information to the production manager and customer.

There have been many approaches to addressing the advanced packaging requirements of microprocessors and portable electronics with successive generations of semiconductors. Many industry road maps have identified significant gaps between the current semiconductor capability and the available supporting electronic packaging technologies. The limitations and issues with current technologies include increasing clock rates, EMI radiation, thermal loads, second level assembly reliability stresses and cost.

As these package systems evolve to incorporate more components with varied environmental needs, the pressure to push the technological envelope becomes increasingly challenging. More significantly, with the ever-increasing complexity, the potential risk of error increases greatly during manufacture.

In view of the ever-increasing commercial competitive pressures, along with growing consumer expectations and the diminishing opportunities for meaningful product differentiation in the marketplace, it is critical that answers be found for these problems. Additionally, the need to reduce costs, reduce production time, improve efficiencies and performance, and meet competitive pressures, adds an even greater urgency to the critical necessity for finding answers to these problems.

Thus, a need remains for smaller footprints and more robust packages and methods for manufacture. Solutions to these problems have been long sought but prior developments have not taught or suggested any solutions and, thus, solutions to these problems have long eluded those skilled in the art.

DISCLOSURE OF THE INVENTION

The present invention provides an integrated circuit package system including: providing a flexible circuit substrate having a fold; mounting an integrated circuit or an integrated circuit package over the flexible circuit substrate and connected to the flexible circuit substrate with interconnects; and encapsulating the integrated circuit or integrated circuit package with a recessed encapsulation having a first level and a second level, the second level having the flexible circuit substrate folded thereover.

Certain embodiments of the invention have other aspects in addition to or in place of those mentioned above. The aspects will become apparent to those skilled in the art from a reading of the following detailed description when taken with reference to the accompanying drawings.

BEST MODE FOR CARRYING OUT THE INVENTION

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

Likewise, the drawings showing embodiments of the system are semi-diagrammatic and not to scale and, particularly, some of the dimensions are for the clarity of presentation and are shown greatly exaggerated in the drawing FIGs. The same numbers are used in all the drawing FIGs. to relate to the same elements.

For expository purposes, the term "horizontal" as used herein is defined as a plane parallel to the plane or surface of the substrate, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane. The term "on" means that there is direct contact among elements.

The term "processing" as used herein includes deposition of material or photoresist, patterning, exposure, development, etching, cleaning, and/or removal of the material or photoresist as required in forming a described structure.

The term "system" as used herein refers to and is defined as the method and as the apparatus of the present invention in accordance with the context in which the term is used. The embodiments have been numbered first embodiment, second embodiment, etc. as a matter of descriptive convenience and are not intended to have any other significance or provide limitations for the present invention.

Figure 1:
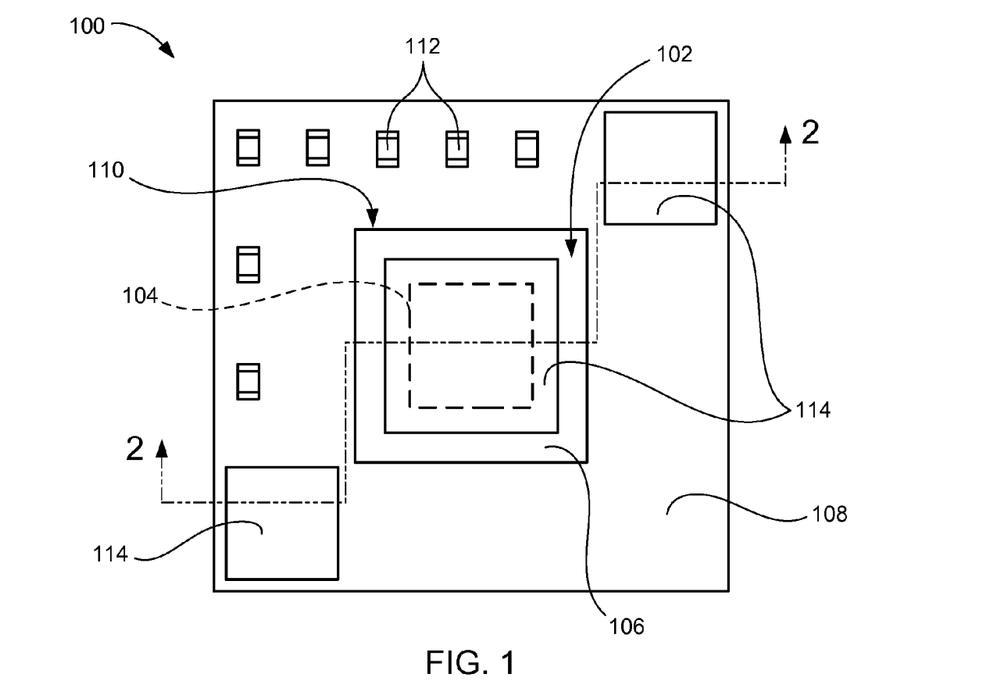
FIG. 1 is a plan view of an integrated circuit package system in accordance with a first embodiment of the present invention.

Referring now to FIG. 1, therein is shown a plan view of an integrated circuit package system 100 in accordance with a first embodiment of the present invention. The integrated circuit package system 100 is shown having a recessed encapsulation 102.

The recessed encapsulation 102 has two distinct levels, such as a first level 104 and a second level 106. Above the second level 106 of the recessed encapsulation 102 is a flexible circuit substrate 108, with a substrate window 110.

The flexible circuit substrate 108 comprises at least one flexible insulating layer, such as: polyimide (PI), polyester, polyethylene napthalate (PEN), Teflon, polyethylene terephthalate (PET), or other polymeric materials.

The flexible circuit substrate 108 also comprises at least one flexible conductive layer such as copper, aluminum, or metallic alloy. The flexible electrically conductive layer provides electrical connections between vias and various interconnects. Above the flexible circuit substrate 108 are mounted passive components 112.

Further above the flexible circuit substrate 108 and the first level 104 of the recessed encapsulation 102 are mounted integrated circuit (IC) packages 114 which may be a wafer level chip scale package (WLCSP), redistributed line (RDL) die, area array package, leadless package, leaded package, system-in-package (SiP), stacked die package, package-in-package (PiP), etc.

Figure 2:
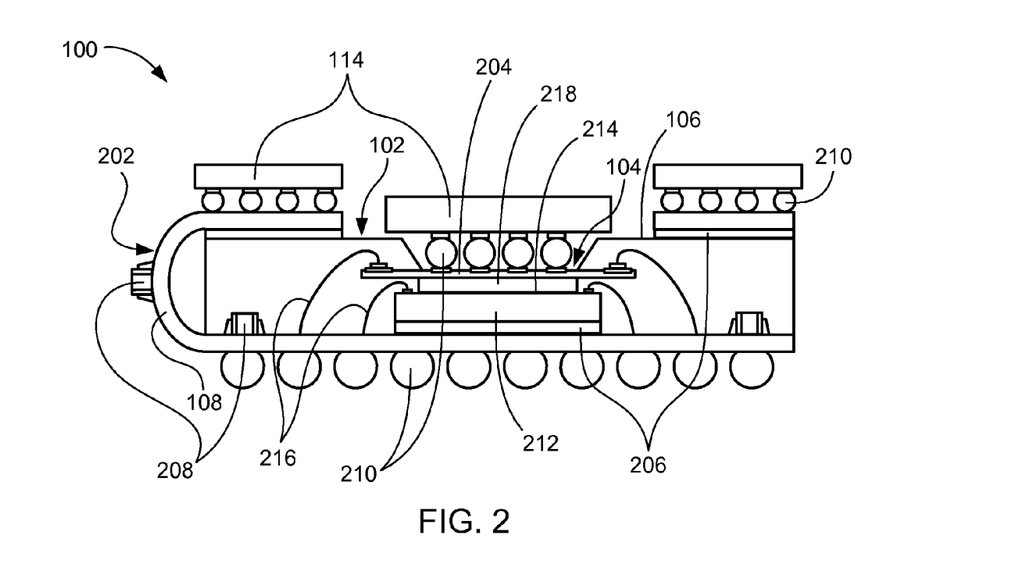
FIG. 2 is a cross-sectional view of the integrated circuit package system along the line 2-2 of FIG. 1.

Referring now to FIG. 2, therein is shown a cross-sectional view of the integrated circuit package system 100 along the line 2-2 of FIG. 1. The integrated circuit package system 100 is shown having the flexible circuit substrate 108 with a single fold 202 folded around the recessed encapsulation 102.

The second level 106 is shown higher than the first level 104 and at least partially surrounds the first level 104. The first level 104 of the recessed encapsulation 102 is shown having an interposer 204 such as a laminated plastic or ceramic substrate.

The flexible circuit substrate 108 is attached to the second level 106 of the recessed encapsulation 102 with a die attach adhesive 206 and is sufficiently supported by the second level 106.

The second level 106 of the recessed encapsulation 102 comprises passive components 208 but may be replaced with a thin die or a low profile package. The passive components 208 are also mounted on the single fold 202.

Mounted above the second level 106 and above the first level 104 of the recessed encapsulation 102 are the IC packages 114. The IC packages 114 are mounted above the flexible circuit substrate 108 and the second level 106 of the recessed encapsulation 102.

The IC packages 114 above the second level 106 are connected to the flexible circuit substrate 108 with interconnects such as solder ball interconnects 210 in a ball grid array (BGA) configuration.

Beneath the first level 104 of the recessed encapsulation 102 an integrated circuit such as a wire-bonded die 212 with an active side 214 is attached to the flexible circuit substrate 108 with the die attach adhesive 206.

The active side 214 of the wire-bonded die 212 is connected to the flexible circuit substrate 108 with interconnects such as bond wires 216. Mounted above the wire-bonded die 212 is a spacer 218. The spacer 218 should have a high thermal conductivity and may be an epoxy film or an adhesive tape.

The interposer 204 is mounted above the spacer 218 and connected from above to the flexible circuit substrate 108 with the bond wires 216.

The IC packages 114 above the first level 104 of the recessed encapsulation 102 are mounted above the interposer 204 and connected to the interposer 204 with the solder ball interconnects 210. Mounted below the flexible circuit substrate 108 are external interconnects, such as the solder ball interconnects 210.

Figure 3:
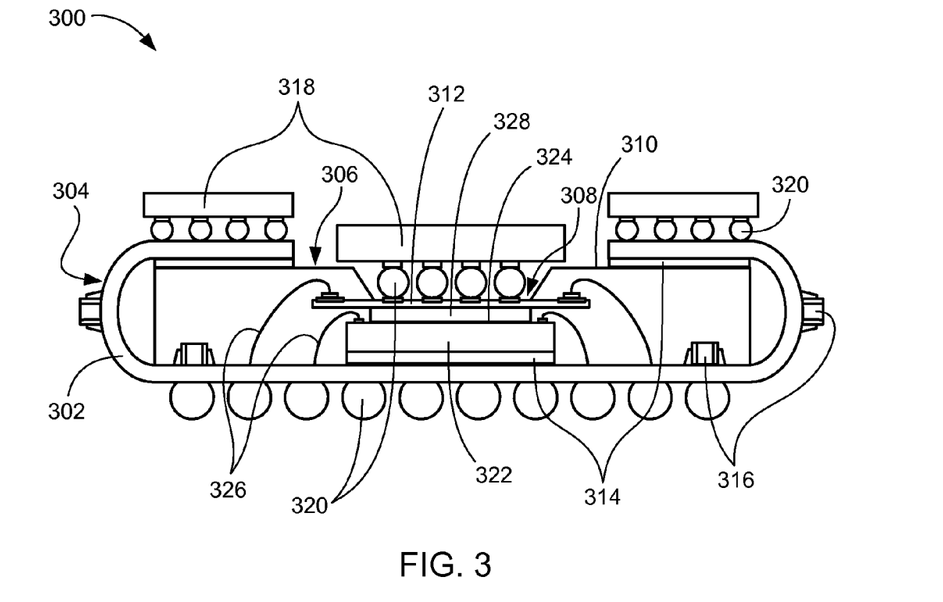
FIG. 3 is a cross-sectional view of an integrated circuit package system in accordance with a second embodiment of the present invention.

Referring now to FIG. 3, therein is shown a cross-sectional view of an integrated circuit package system 300 in accordance with a second embodiment of the present invention. The integrated circuit package system 300 is shown having a flexible circuit substrate 302 with folds 304. The flexible circuit substrate 302 is folded around a recessed encapsulation 306.

The flexible circuit substrate 302 comprises at least one flexible insulating layer, such as: polyimide (PI), polyester, polyethylene napthalate (PEN), Teflon, polyethylene terephthalate (PET), or other polymeric materials.

The flexible circuit substrate 302 also comprises at least one flexible conductive layer such as copper, aluminum, or metallic alloy. The flexible electrically conductive layer provides electrical connections between vias and various interconnects.

The recessed encapsulation 306 has two distinct levels, such as a first level 308 and a second level 310. The second level 310 is shown higher than the first level 308 and at least partially surrounds the first level 308.

The first level 308 of the recessed encapsulation 306 is shown having an interposer 312 such as a laminated plastic or ceramic substrate. The flexible circuit substrate 302 is attached to the second level 310 of the recessed encapsulation 306 with a die attach adhesive 314 and is sufficiently supported by the second level 310.

The second level 310 of the recessed encapsulation 306 comprises passive components 316 but may be replaced with a thin die or a low profile package. The passive components 316 are also mounted on the folds 304.

Mounted above the second level 310 and above the first level 308 of the recessed encapsulation 306 are IC packages 318. The IC packages 318 may be replaced with a wafer level chip scale package (WLCSP), redistributed line (RDL) die, area array package, leadless package, leaded package, system-in-package (SiP), stacked die package, package-in-package (PiP), etc.

The IC packages 318 are mounted above the flexible circuit substrate 302 and the second level 310 of the recessed encapsulation 306.

The IC packages 318 above the second level 310 are connected to the flexible circuit substrate 302 with interconnects such as solder ball interconnects 320 in a ball grid array (BGA) configuration.

Beneath the first level 308 of the recessed encapsulation 306 an integrated circuit such as a wire-bonded die 322 with an active side 324 is attached to the flexible circuit substrate 302 with the die attach adhesive 314.

The active side 324 of the wire-bonded die 322 is connected to the flexible circuit substrate 302 with interconnects such as bond wires 326. Mounted above the wire-bonded die 322 is a spacer 328. The spacer 328 should have a high thermal conductivity and may be an epoxy film or an adhesive tape.

The interposer 312 is mounted above the spacer 328 and connected from above to the flexible circuit substrate 302 with the bond wires 326.

The IC packages 318 above the first level 308 of the recessed encapsulation 306 are mounted above the interposer 312 and connected to the interposer 312 with the solder ball interconnects 320. Mounted below the flexible circuit substrate 302 are external interconnects, such as the solder ball interconnects 320.

Figure 4:
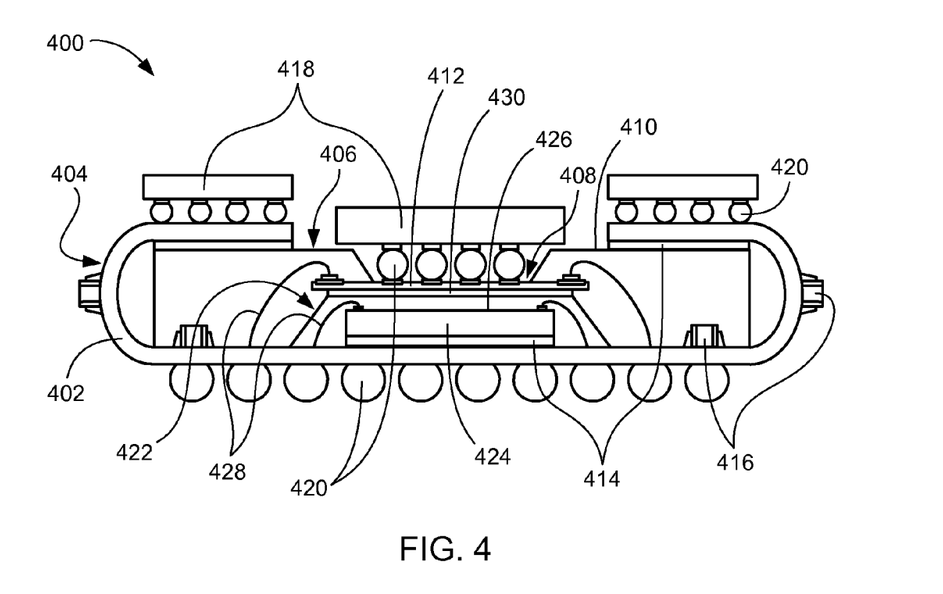
FIG. 4 is a cross-sectional view of an integrated circuit package system in accordance with a third embodiment of the present invention.

Referring now to FIG. 4, therein is shown a cross-sectional view of an integrated circuit package system 400 in accordance with a third embodiment of the present invention. The integrated circuit package system 400 is shown having a flexible circuit substrate 402 with folds 404. The flexible circuit substrate 402 is folded around a recessed encapsulation 406.

The flexible circuit substrate 402 comprises at least one flexible insulating layer, such as: polyimide (PI), polyester, polyethylene napthalate (PEN), Teflon, polyethylene terephthalate (PET), or other polymeric materials.

The flexible circuit substrate 402 also comprises at least one flexible conductive layer such as copper, aluminum, or metallic alloy. The flexible electrically conductive layer provides electrical connections between vias and various interconnects.

The recessed encapsulation 406 has two distinct levels, such as a first level 408 and a second level 410. The second level 410 is shown higher than the first level 408 and at least partially surrounds the first level 408.

The first level 408 of the recessed encapsulation 406 is shown having an interposer 412 such as a laminated plastic or ceramic substrate. The flexible circuit substrate 402 is attached to the second level 410 of the recessed encapsulation 406 with a die attach adhesive 414 and is sufficiently supported by the second level 410.

The second level 410 of the recessed encapsulation 406 comprises passive components 416 but may be replaced with a thin die or a low profile package. The passive components 416 are also mounted on the folds 404.

Mounted above the second level 410 and above the first level 408 of the recessed encapsulation 406 are IC packages 418. The IC packages 418 may be replaced with a wafer level chip scale package (WLCSP), redistributed line (RDL) die, area array package, leadless package, leaded package, system-in-package (SiP), stacked die package, package-in-package (PiP), etc.

The IC packages 418 are mounted above the flexible circuit substrate 402 and the second level 410 of the recessed encapsulation 406. The IC packages 418 above the second level 410 are connected to the flexible circuit substrate 402 with interconnects such as solder ball interconnects 420 in a ball grid array (BGA) configuration.

Beneath the first level 408 of the recessed encapsulation 406, an integrated circuit package such as a pre-mold package 422 is attached to the flexible circuit substrate 402. The pre-mold package 422 has an integrated circuit such as a wire-bonded die 424 having an active side 426.

The active side 426 of the wire-bonded die 424 is connected to the flexible circuit substrate 402 with interconnects such as bond wires 428. Mounted above the wire-bonded die 424 is a spacer 430. The spacer 430 should have a high thermal conductivity and may be an epoxy film or an adhesive tape.

The interposer 412 is mounted above the spacer 430 and connected from above to the flexible circuit substrate 402 with the bond wires 428.

The IC packages 418 above the first level 408 of the recessed encapsulation 406 are mounted above the interposer 412 and connected to the interposer 412 with the solder ball interconnects 420. Mounted below the flexible circuit substrate 402 are external interconnects, such as the solder ball interconnects 420.

Figure 5:
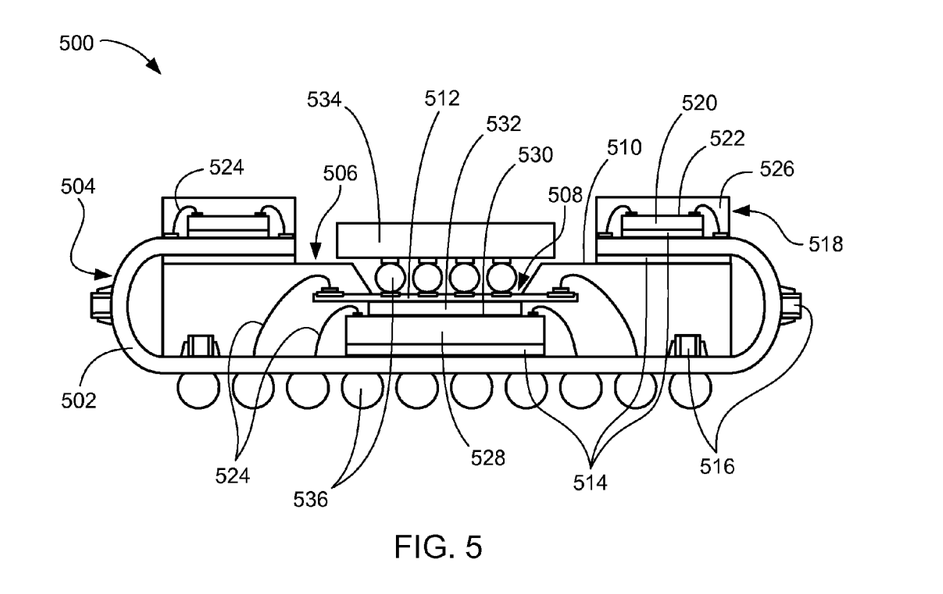
FIG. 5 is a cross-sectional view of an integrated circuit package system in accordance with a fourth embodiment of the present invention.

Referring now to FIG. 5, therein is shown a cross-sectional view of an integrated circuit package system 500 in accordance with a fourth embodiment of the present invention. The integrated circuit package system 500 is shown having a flexible circuit substrate 502 with folds 504. The flexible circuit substrate 502 is folded around a recessed encapsulation 506.

The flexible circuit substrate 502 comprises at least one flexible insulating layer, such as: polyimide (PI), polyester, polyethylene napthalate (PEN), Teflon, polyethylene terephthalate (PET), or other polymeric materials.

The flexible circuit substrate 502 also comprises at least one flexible conductive layer such as copper, aluminum, or metallic alloy. The flexible electrically conductive layer provides electrical connections between vias and various interconnects.

The recessed encapsulation 506 has two distinct levels, such as a first level 508 and a second level 510. The second level 510 is shown higher than the first level 508 and at least partially surrounds the first level 508.

The first level 508 of the recessed encapsulation 506 is shown having an interposer 512 such as a laminated plastic or ceramic substrate. The flexible circuit substrate 502 is attached to the second level 510 of the recessed encapsulation 506 with a die attach adhesive 514 and is sufficiently supported by the second level 510.

The second level 510 of the recessed encapsulation 506 comprises passive components 516 but may be replaced with a thin die or a low profile package. The passive components 516 are also mounted on the folds 504. Mounted above the second level 510 of the recessed encapsulation 506 are IC packages such as pre-molded IC packages 518.

The pre-mold IC packages 518 may be replaced with a wafer level chip scale package (WLCSP), redistributed line (RDL) die, area array package, leadless package, leaded package, system-in-package (SiP), stacked die package, package-in-package (PiP), etc. The pre-mold IC packages 518 are mounted above the flexible circuit substrate 502 and the second level 510 of the recessed encapsulation 506. The pre-mold IC packages 518 are shown having a pre-mold wire-bonded die 520 with an active side 522.

The active side 522 of the pre-mold wire-bonded die 520 is connected to the flexible circuit substrate 502 with interconnects such as bond wires 524. The pre-mold IC packages 518 have an encapsulation 526 encapsulating the bond wires 524 and the pre-mold wire-bonded die 520.

Beneath the first level 508 of the recessed encapsulation 506 an integrated circuit such as a wire-bonded die 528 with an active side 530 is attached to the flexible circuit substrate 502 with the die attach adhesive 514. The active side 530 of the wire-bonded die 528 is connected to the flexible circuit substrate 502 with the bond wires 524.

Mounted above the wire-bonded die 528 is a spacer 532. The spacer 532 should have a high thermal conductivity and may be an epoxy film or an adhesive tape. The interposer 512 is mounted above the spacer 532 and connected from above to the flexible circuit substrate 502 with the bond wires 524.

Above the first level 508 an IC package 534 is mounted above the interposer 512 and connected to the interposer 512 with interconnects such as solder ball interconnects 536. Mounted below the flexible circuit substrate 502 are external interconnects, such as the solder ball interconnects 536.

Figure 6:
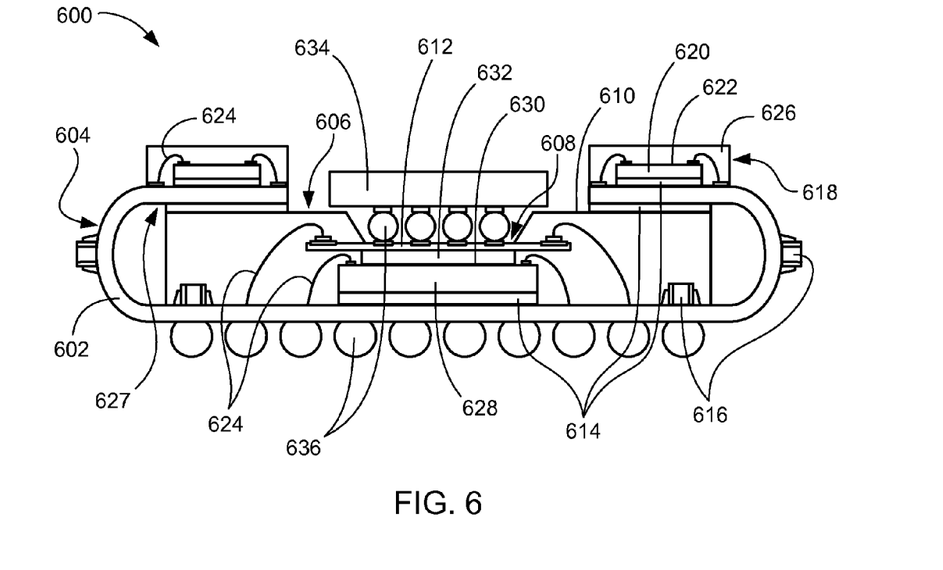
FIG. 6 is a cross-sectional view of an integrated circuit package system in accordance with a fifth embodiment of the present invention.

Referring now to FIG. 6, therein is shown a cross-sectional view of an integrated circuit package system 600 in accordance with a fifth embodiment of the present invention. The integrated circuit package system 600 is shown having a flexible circuit substrate 602 with folds 604. The flexible circuit substrate 602 is folded around a recessed encapsulation 606.

The flexible circuit substrate 602 comprises at least one flexible insulating layer, such as: polyimide (PI), polyester, polyethylene napthalate (PEN), Teflon, polyethylene terephthalate (PET), or other polymeric materials.

The flexible circuit substrate 602 also comprises at least one flexible conductive layer such as copper, aluminum, or metallic alloy. The flexible electrically conductive layer provides electrical connections between vias and various interconnects.

The recessed encapsulation 606 has two distinct levels, such as a first level 608 and a second level 610. The second level 610 is shown higher than the first level 608 and at least partially surrounds the first level 608.

The first level 608 of the recessed encapsulation 606 is shown having an interposer 612 such as a laminated plastic or ceramic substrate. The flexible circuit substrate 602 is attached to the second level 610 of the recessed encapsulation 606 with a die attach adhesive 614 and is sufficiently supported by the second level 610.

The second level 610 of the recessed encapsulation 606 comprises passive components 616 but may be replaced with a thin die or a low profile package. The passive components 616 are also mounted on the folds 604.

Mounted above the second level 610 of the recessed encapsulation 606 are IC packages such as pre-molded IC packages 618. The pre-mold IC packages 618 may be replaced with a wafer level chip scale package (WLCSP), redistributed line (RDL) die, area array package, leadless package, leaded package, system-in-package (SiP), stacked die package, package-in-package (PiP), etc. The IC packages 618 are mounted above the flexible circuit substrate 602 and the second level 610 of the recessed encapsulation 606.

The pre-mold IC packages 618 are shown having a pre-mold wire-bonded die 620 with an active side 622. The active side 622 of the pre-mold wire-bonded die 620 is connected to the flexible circuit substrate 602 with interconnects such as bond wires 624. The pre-mold IC packages 618 have an encapsulation 626 encapsulating the bond wires 624 and the pre-mold wire-bonded die 620.

The pre-mold IC packages 618 are mounted with an overhang 627 in relation to the recessed encapsulation 606. Beneath the first level 608 of the recessed encapsulation 606 an integrated circuit such as a wire-bonded die 628 with an active side 630 is attached to the flexible circuit substrate 602 with the die attach adhesive 614.

The active side 630 of the wire-bonded die 628 is connected to the flexible circuit substrate 602 with the bond wires 624. Mounted above the wire-bonded die 628 is a spacer 632. The spacer 632 should have a high thermal conductivity and may be an epoxy film or an adhesive tape.

The interposer 612 is mounted above the spacer 632 and connected from above to the flexible circuit substrate 602 with the bond wires 624.

Above the first level 608 an IC package 634 is mounted above the interposer 612 and connected to the interposer 612 with interconnects such as solder ball interconnects 636. Mounted below the flexible circuit substrate 602 are external interconnects, such as the solder ball interconnects 636.

Figure 7:
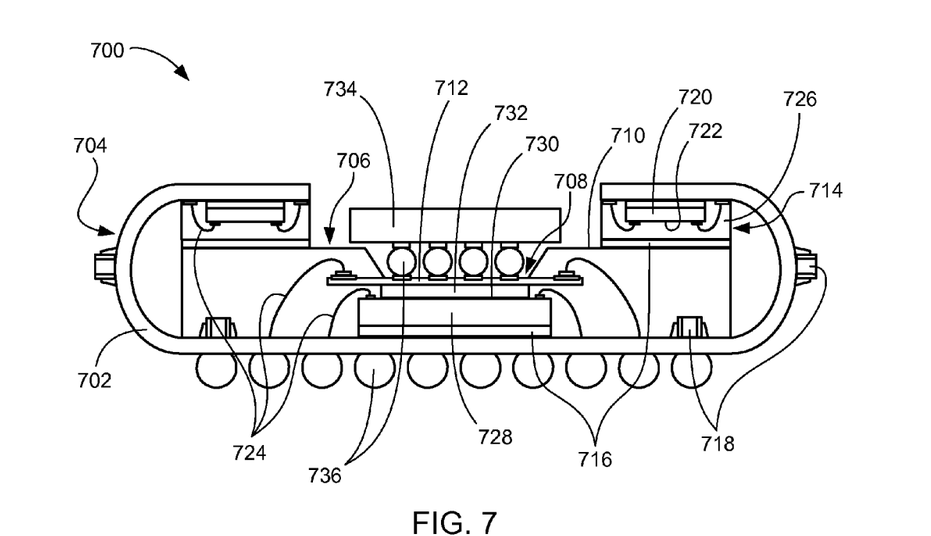
FIG. 7 is a cross-sectional view of an integrated circuit package system in accordance with a sixth embodiment of the present invention.

Referring now to FIG. 7, therein is shown a cross-sectional view of an integrated circuit package system 700 in accordance with a sixth embodiment of the present invention. The integrated circuit package system 700 is shown having a flexible circuit substrate 702 with folds 704. The flexible circuit substrate 702 is folded around a recessed encapsulation 706.

The flexible circuit substrate 702 comprises at least one flexible insulating layer, such as: polyimide (PI), polyester, polyethylene napthalate (PEN), Teflon, polyethylene terephthalate (PET), or other polymeric materials.

The flexible circuit substrate 702 also comprises at least one flexible conductive layer such as copper, aluminum, or metallic alloy. The flexible electrically conductive layer provides electrical connections between vias and various interconnects.

The recessed encapsulation 706 has two distinct levels, such as a first level 708 and a second level 710. The second level 710 is shown higher than the first level 708 and at least partially surrounds the first level 708.

The first level 708 of the recessed encapsulation 706 is shown having an interposer 712 such as a laminated plastic or ceramic substrate. Between the flexible circuit substrate 702 and the second level 710 of the recessed encapsulation 706 are IC packages such as pre-mold IC packages 714. The pre-mold IC packages 714 are attached to the second level 710 with a die attach adhesive 716.

The second level 710 of the recessed encapsulation 706 comprises passive components 718 but may be replaced with a thin die or a low profile package. The passive components 718 are also mounted on the folds 704.

The pre-mold IC packages 714 may be replaced with a wafer level chip scale package (WLCSP), redistributed line (RDL) die, area array package, leadless package, leaded package, system-in-package (SiP), stacked die package, package-in-package (PiP), etc.

The flexible circuit substrate 702 is folded over the pre-mold IC packages 714 and the second level 710 of the recessed encapsulation 706. Optionally additional IC packages may be mounted to the flexible circuit substrate 702 above the second level 710 of the recessed encapsulation 706.

The pre-mold IC packages 714 are shown having a pre-mold wire-bonded die 720 with an active side 722. The active side 722 of the pre-mold wire-bonded die 720 is connected to the flexible circuit substrate 702 with interconnects such as bond wires 724. The pre-mold IC packages 714 have an encapsulation 726 encapsulating the bond wires 724 and the pre-mold wire-bonded die 720.

The active side 722 of the pre-mold wire-bonded die 720 faces the second level 710 of the recessed encapsulation 706. Beneath the first level 708 of the recessed encapsulation 706 an integrated circuit such as a wire-bonded die 728 with an active side 730 is attached to the flexible circuit substrate 702 with the die attach adhesive 716.

The active side 730 of the wire-bonded die 728 is connected to the flexible circuit substrate 702 with the bond wires 724. Mounted above the wire-bonded die 728 is a spacer 732.

The spacer 732 should have a high thermal conductivity and may be an epoxy film or an adhesive tape. The interposer 712 is mounted above the spacer 732 and connected from above to the flexible circuit substrate 702 with the bond wires 724.

Above the first level 708 an IC package 734 is mounted above the interposer 712 and connected to the interposer 712 with interconnects such as solder ball interconnects 736. Mounted below the flexible circuit substrate 702 are external interconnects, such as the solder ball interconnects 736.

Figure 8:
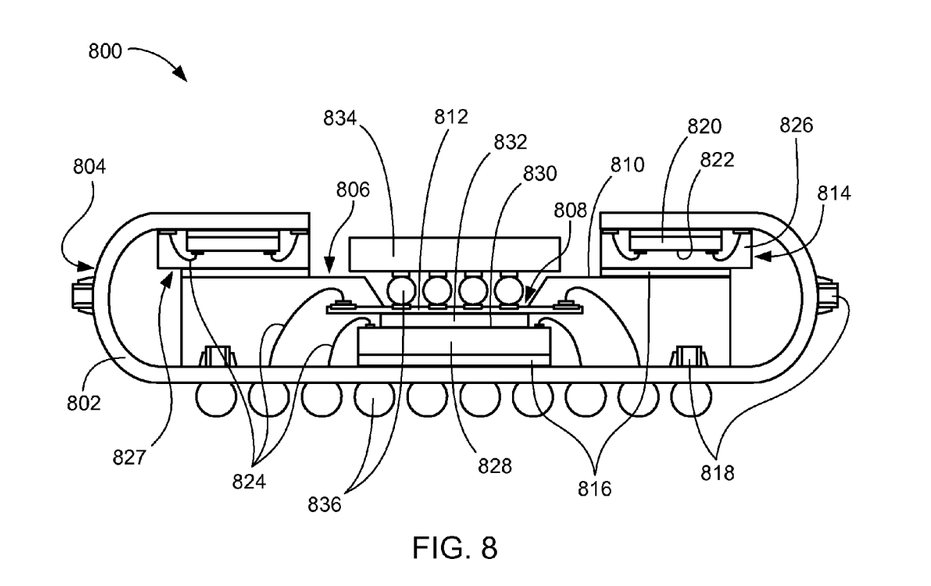
FIG. 8 is a cross-sectional view of an integrated circuit package system in accordance with a seventh embodiment of the present invention.

Referring now to FIG. 8, therein is shown a cross-sectional view of an integrated circuit package system 800 in accordance with a seventh embodiment of the present invention. The integrated circuit package system 800 is shown having a flexible circuit substrate 802 with folds 804. The flexible circuit substrate 802 is folded around a recessed encapsulation 806.

The flexible circuit substrate 802 comprises at least one flexible insulating layer, such as: polyimide (PI), polyester, polyethylene napthalate (PEN), Teflon, polyethylene terephthalate (PET), or other polymeric materials.

The flexible circuit substrate 802 also comprises at least one flexible conductive layer such as copper, aluminum, or metallic alloy. The flexible electrically conductive layer provides electrical connections between vias and various interconnects.

The recessed encapsulation 806 has two distinct levels, such as a first level 808 and a second level 810. The second level 810 is shown higher than the first level 808 and at least partially surrounds the first level 808.

The first level 808 of the recessed encapsulation 806 is shown having an interposer 812 such as a laminated plastic or ceramic substrate. Between the flexible circuit substrate 802 and the second level 810 of the recessed encapsulation 806 are IC packages such as pre-mold IC packages 814. The pre-mold IC packages 814 are attached to the second level 810 with a die attach adhesive 816.

The second level 810 of the recessed encapsulation 806 comprises passive components 818 but may be replaced with a thin die or a low profile package. The passive components 818 are also mounted on the folds 804.

The pre-mold IC packages 814 may be replaced with a wafer level chip scale package (WLCSP), redistributed line (RDL) die, area array package, leadless package, leaded package, system-in-package (SiP), stacked die package, package-in-package (PiP), etc.

The flexible circuit substrate 802 is folded over the pre-mold IC packages 814 and the second level 810 of the recessed encapsulation 806. Optionally additional IC packages may be mounted to the flexible circuit substrate 802 above the second level 810 of the recessed encapsulation 806.

The pre-mold IC packages 814 are shown having a pre-mold wire-bonded die 820 with an active side 822. The active side 822 of the pre-mold wire-bonded die 820 is connected to the flexible circuit substrate 802 with interconnects such as bond wires 824. The pre-mold IC packages 814 have an encapsulation 826 encapsulating the bond wires 824 and the pre-mold wire-bonded die 820.

The active side 822 of the pre-mold wire-bonded die 820 faces the second level 810 of the recessed encapsulation 806. The pre-mold IC packages 814 are mounted with an overhang 827 of the second level 810.

Beneath the first level 808 of the recessed encapsulation 806 an integrated circuit such as a wire-bonded die 828 with an active side 830 is attached to the flexible circuit substrate 802 with the die attach adhesive 816. The active side 830 of the wire-bonded die 828 is connected to the flexible circuit substrate 802 with the bond wires 824. Mounted above the wire-bonded die 828 is a spacer 832.

The spacer 832 should have a high thermal conductivity and may be an epoxy film or an adhesive tape. The interposer 812 is mounted above the spacer 832 and connected from above to the flexible circuit substrate 802 with the bond wires 824.

Above the first level 808 an IC package 834 is mounted above the interposer 812 and connected to the interposer 812 with interconnects such as solder ball interconnects 836.

Mounted below the flexible circuit substrate 802 are external interconnects, such as the solder ball interconnects 836.

Figure 9:
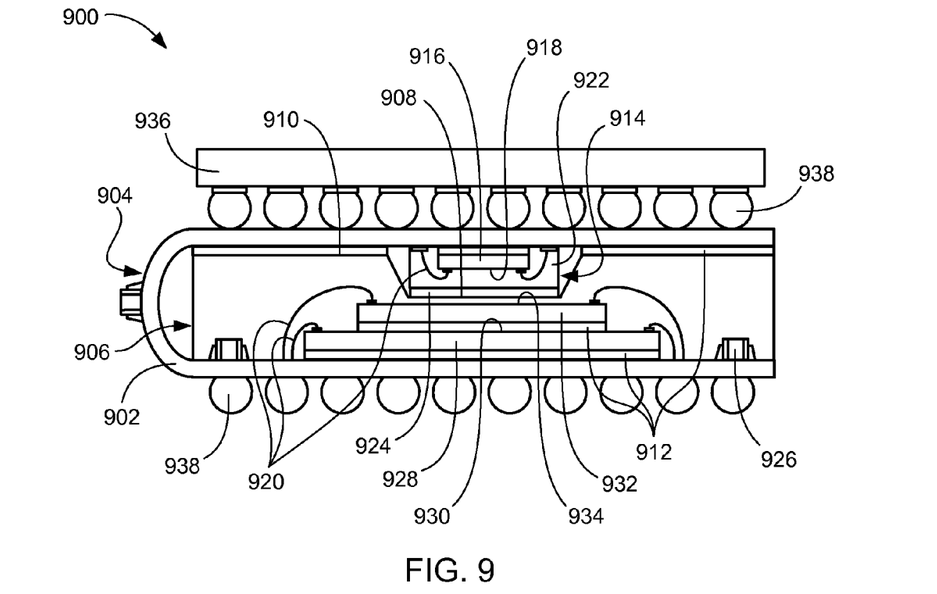
FIG. 9 is a cross-sectional view of an integrated circuit package system in accordance with an eighth embodiment of the present invention.

Referring now to FIG. 9, therein is shown a cross-sectional view of an integrated circuit package system 900 in accordance with an eighth embodiment of the present invention. The integrated circuit package system 900 is shown having a flexible circuit substrate 902 with a fold 904. The flexible circuit substrate 902 is folded around a recessed encapsulation 906.

The flexible circuit substrate 902 comprises at least one flexible insulating layer, such as: polyimide (PI), polyester, polyethylene napthalate (PEN), Teflon, polyethylene terephthalate (PET), or other polymeric materials.

The flexible circuit substrate 902 also comprises at least one flexible conductive layer such as copper, aluminum, or metallic alloy. The flexible electrically conductive layer provides electrical connections between vias and various interconnects.

The recessed encapsulation 906 has two distinct levels, such as a first level 908 and a second level 910. The second level 910 is shown higher than the first level 908 and at least partially surrounds the first level 908.

The flexible circuit substrate 902 is attached to the second level with a die attach adhesive 912. Above the first level 908 of the recessed encapsulation 906 is an integrated circuit package such as a pre-mold IC package 914. The pre-mold IC package 914 may be replaced with a wafer level chip scale package (WLCSP), redistributed line (RDL) die, area array package, leadless package, leaded package, system-in-package (SiP), stacked die package, package-in-package (PiP), etc.

The flexible circuit substrate 902 is folded over the pre-mold IC package 914 and the first level 908 of the recessed encapsulation 906. The pre-mold IC package 914 is shown having a pre-mold wire-bonded die 916 with an active side 918.

The active side 918 of the pre-mold wire-bonded die 916 is connected to the flexible circuit substrate 902 with interconnects such as bond wires 920. The pre-mold IC package 914 has an encapsulation 922 encapsulating the bond wires 920 and the pre-mold wire-bonded die 916.

The active side 918 of the pre-mold wire-bonded die 916 faces the first level 908 of the recessed encapsulation 906. The pre-mold wire-bonded die 916 is attached to the first level 908 of the recessed encapsulation 906 with an adhesive 924. The adhesive 924 should have a high thermal conductivity and may be an epoxy film or an adhesive tape.

The second level 910 of the recessed encapsulation 906 comprises passive components 926 but may be replaced with a thin die or a low profile package. The passive components 926 may also be mounted on the fold 904.

Beneath the first level 908 of the recessed encapsulation 906 an integrated circuit such as a first wire-bonded die 928 with an active side 930 is attached to the flexible circuit substrate 902 with the die attach adhesive 912.

The active side 930 of the first wire-bonded die 928 is connected to the flexible circuit substrate 902 with the bond wires 920. Above the first wire-bonded die 928 is an integrated circuit such as a second wire-bonded die 932 with an active side 934.

The active side 934 of the second wire-bonded die 932 is connected to the flexible circuit substrate 902 with the bond wires 920. The second wire-bonded die 932 is attached to the active side 930 of the first wire-bonded die 928 with the die attach adhesive 912.

Above the flexible circuit substrate 902 is mounted an IC package 936 and connected to the flexible circuit substrate 902 with interconnects such as solder ball interconnects 938 in a ball grid array (BGA) layout. Mounted below the flexible circuit substrate 902 are external interconnects, such as the solder ball interconnects 938.

Figure 10:
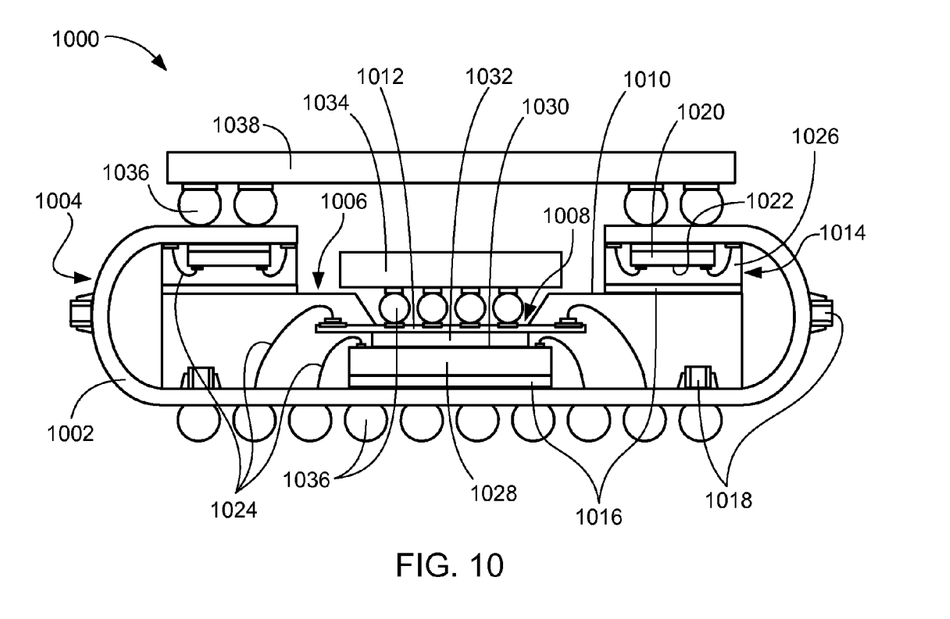
FIG. 10 is a cross-sectional view of an integrated circuit package system in accordance with an ninth embodiment of the present invention.

Referring now to FIG. 10, therein is shown a cross-sectional view of an integrated circuit package system 1000 in accordance with an ninth embodiment of the present invention. The integrated circuit package system 1000 is shown having a flexible circuit substrate 1002 with folds 1004. The flexible circuit substrate 1002 is folded around a recessed encapsulation 1006.

The flexible circuit substrate 1002 comprises at least one flexible insulating layer, such as: polyimide (PI), polyester, polyethylene napthalate (PEN), Teflon, polyethylene terephthalate (PET), or other polymeric materials.

The flexible circuit substrate 1002 also comprises at least one flexible conductive layer such as copper, aluminum, or metallic alloy. The flexible electrically conductive layer provides electrical connections between vias and various interconnects.

The recessed encapsulation 1006 has two distinct levels, such as a first level 1008 and a second level 1010. The second level 1010 is shown higher than the first level 1008 and at least partially surrounds the first level 1008.

The first level 1008 of the recessed encapsulation 1006 is shown having an interposer 1012 such as a laminated plastic or ceramic substrate. Between the flexible circuit substrate 1002 and the second level 1010 of the recessed encapsulation 1006 are IC packages such as pre-mold IC packages 1014. The pre-mold IC packages 1014 are attached to the second level 1010 with a die attach adhesive 1016.

The second level 1010 of the recessed encapsulation 1006 comprises passive components 1018 but may be replaced with a thin die or a low profile package. The passive components 1018 are also mounted on the folds 1004.

The pre-mold IC packages 1014 may be replaced with a wafer level chip scale package (WLCSP), redistributed line (RDL) die, area array package, leadless package, leaded package, system-in-package (SiP), stacked die package, package-in-package (PiP), etc.

The flexible circuit substrate 1002 is folded over the pre-mold IC packages 1014 and the second level 1010 of the recessed encapsulation 1006. Optionally additional IC packages may be mounted to the flexible circuit substrate 1002 above the second level 1010 of the recessed encapsulation 1006.

The pre-mold IC packages 1014 are shown having a pre-mold wire-bonded die 1020 with an active side 1022. The active side 1022 of the pre-mold wire-bonded die 1020 is connected to the flexible circuit substrate 1002 with interconnects such as bond wires 1024. The pre-mold IC packages 1014 have an encapsulation 1026 encapsulating the bond wires 1024 and the pre-mold wire-bonded die 1020.

The active side 1022 of the pre-mold wire-bonded die 1020 faces the second level 1010 of the recessed encapsulation 1006. Beneath the first level 1008 of the recessed encapsulation 1006 an integrated circuit such as a wire-bonded die 1028 with an active side 1030 is attached to the flexible circuit substrate 1002 with the die attach adhesive 1016.

The active side 1030 of the wire-bonded die 1028 is connected to the flexible circuit substrate 1002 with the bond wires 1024. Mounted above the wire-bonded die 1028 is a spacer 1032.

The spacer 1032 should have a high thermal conductivity and may be an epoxy film or an adhesive tape. The interposer 1012 is mounted above the spacer 1032 and connected from above to the flexible circuit substrate 1002 with the bond wires 1024.

Above the first level 1008 an IC package 1034 is mounted above the interposer 1012 and connected to the interposer 1012 with interconnects such as solder ball interconnects 1036. Bridging the flexible circuit substrate 1002 a second IC package 1038 is connected to the flexible circuit substrate 1002 above the second level 1010 with the solder ball interconnects 1036.

Mounted below the flexible circuit substrate 1002 are external interconnects, such as the solder ball interconnects 1036.

Figure 11:
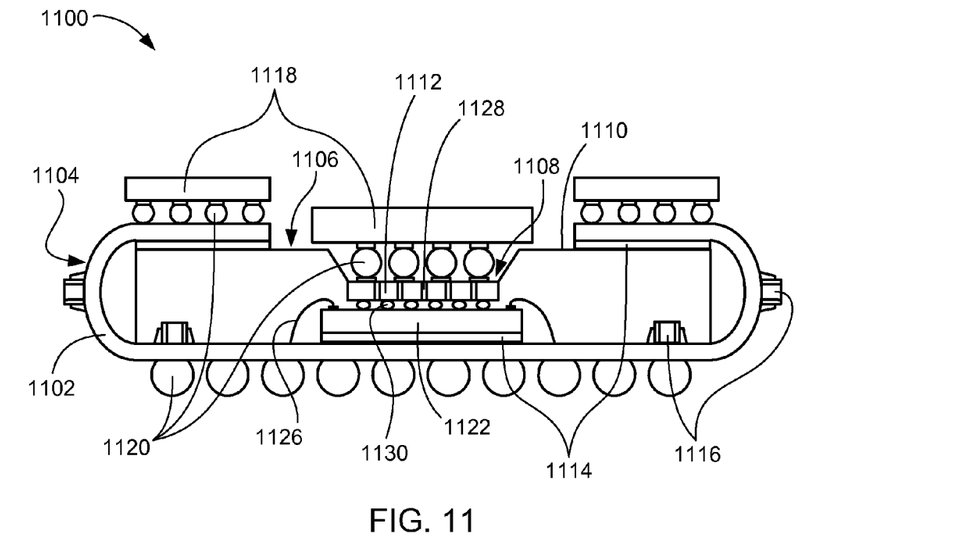
FIG. 11 is a cross-sectional view of an integrated circuit package system in accordance with a tenth embodiment of the present invention.

Referring now to FIG. 11, therein is shown a cross-sectional view of an integrated circuit package system 1100 in accordance with a tenth embodiment of the present invention. The integrated circuit package system 1100 is shown having a flexible circuit substrate 1102 with folds 1104. The flexible circuit substrate 1102 is folded around a recessed encapsulation 1106.

The flexible circuit substrate 1102 comprises at least one flexible insulating layer, such as: polyimide (PI), polyester, polyethylene napthalate (PEN), Teflon, polyethylene terephthalate (PET), or other polymeric materials.

The flexible circuit substrate 1102 also comprises at least one flexible conductive layer such as copper, aluminum, or metallic alloy. The flexible electrically conductive layer provides electrical connections between vias and various interconnects.

The recessed encapsulation 1106 has two distinct levels, such as a first level 1108 and a second level 1110. The second level 1110 is shown higher than the first level 1108 and at least partially surrounds the first level 1108. The first level 1108 of the recessed encapsulation 1106 is shown having a silicon interposer 1112.

The flexible circuit substrate 1102 is attached to the second level 1110 of the recessed encapsulation 1106 with a die attach adhesive 1114 and is sufficiently supported by the second level 1110.

The second level 1110 of the recessed encapsulation 1106 comprises passive components 1116 but may be replaced with a thin die or a low profile package. The passive components 1116 are also mounted on the folds 1104.

Mounted above the second level 1110 and above the first level 1108 of the recessed encapsulation 1106 are IC packages 1118. The IC packages 1118 may be replaced with a wafer level chip scale package (WLCSP), redistributed line (RDL) die, area array package, leadless package, leaded package, system-in-package (SiP), stacked die package, package-in-package (PiP), etc.

The IC packages 1118 are mounted above the flexible circuit substrate 1102 and the second level 1110 of the recessed encapsulation 1106. The IC packages 1118 above the second level 1110 are connected to the flexible circuit substrate 1102 with interconnects such as solder ball interconnects 1120 in a ball grid array (BGA) configuration.

Beneath the first level 1108 of the recessed encapsulation 1106 an IC package 1122 is attached to the flexible circuit substrate 1102 with the die attach adhesive 1114. The IC package is connected from above to the flexible circuit substrate 1102 with interconnects such as bond wires 1126.

Mounted above the IC package 1122 is the silicon interposer 1112. The silicon interposer 1112 has through silicon vias 1128 and microbumps 1130 that connect the IC package 1122 to the IC packages 1118 mounted above the first level 1108 of the recessed encapsulation 1106.

The IC packages 1118 mounted above the first level 1108 of the recessed encapsulation 1106 are connected to the silicon interposer 1112 with the solder ball interconnects 1120. Mounted below the flexible circuit substrate 1102 are external interconnects, such as the solder ball interconnects 1120.

Figure 12:
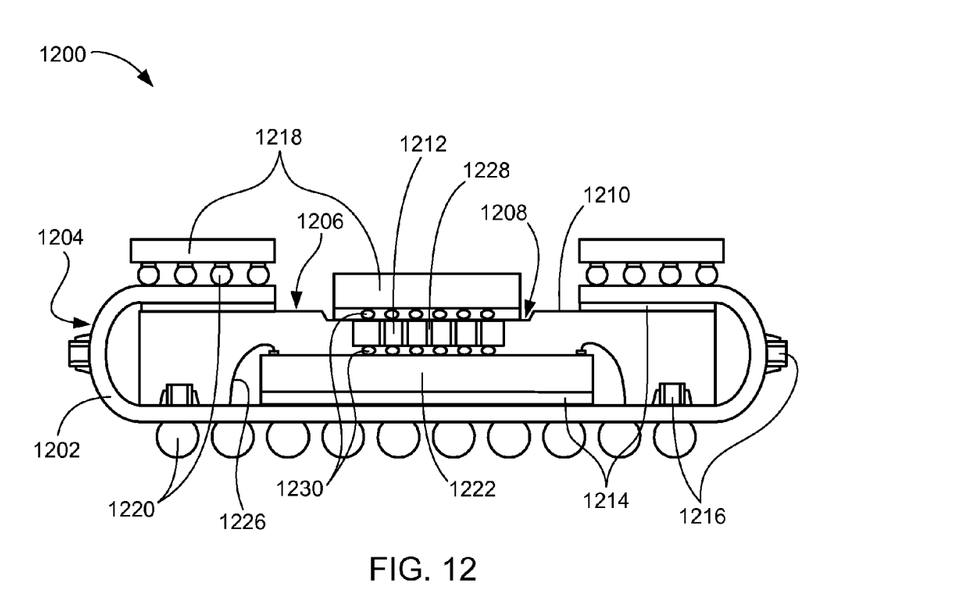
FIG. 12 is a cross-sectional view of an integrated circuit package system in accordance with an eleventh embodiment of the present invention.

Referring now to FIG. 12, therein is shown a cross-sectional view of an integrated circuit package system 1200 in accordance with an eleventh embodiment of the present invention. The integrated circuit package system 1200 is shown having a flexible circuit substrate 1202 with folds 1204. The flexible circuit substrate 1202 is folded around a recessed encapsulation 1206.

The flexible circuit substrate 1202 comprises at least one flexible insulating layer, such as: polyimide (PI), polyester, polyethylene napthalate (PEN), Teflon, polyethylene terephthalate (PET), or other polymeric materials.

The flexible circuit substrate 1202 also comprises at least one flexible conductive layer such as copper, aluminum, or metallic alloy. The flexible electrically conductive layer provides electrical connections between vias and various interconnects.

The recessed encapsulation 1206 has two distinct levels, such as a first level 1208 and a second level 1210. The first level 1208 of the recessed encapsulation 1206 is shown having a silicon interposer 1212. The flexible circuit substrate 1202 is attached to the second level 1210 of the recessed encapsulation 1206 with a die attach adhesive 1214 and is sufficiently supported by the second level 1210.

The second level 1210 of the recessed encapsulation 1206 comprises passive components 1216 but may be replaced with a thin die or a low profile package. The passive components 1216 are also mounted on the folds 1204.

Mounted above the second level 1210 and above the first level 1208 of the recessed encapsulation 1206 are IC packages 1218. The IC packages 1218 may be replaced with a wafer level chip scale package (WLCSP), redistributed line (RDL) die, area array package, leadless package, leaded package, system-in-package (SiP), stacked die package, package-in-package (PiP), etc.

The IC packages 1218 are mounted above the flexible circuit substrate 1202 and the second level 1210 of the recessed encapsulation 1206. The IC packages 1218 above the second level 1210 are connected to the flexible circuit substrate 1202 with interconnects such as solder ball interconnects 1220 in a ball grid array (BGA) configuration.

Beneath the first level 1208 of the recessed encapsulation 1206 an IC package 1222 is attached to the flexible circuit substrate 1202 with the die attach adhesive 1214. The IC package is connected from above to the flexible circuit substrate 1202 with interconnects such as bond wires 1226.

Mounted above the IC package 1222 is the silicon interposer 1212. The silicon interposer 1212 has through silicon vias 1228 and microbumps 1230 that connect the IC package 1222 to the IC packages 1218 mounted above the first level 1208 of the recessed encapsulation 1206.

The IC packages 1218 mounted above the first level 1208 of the recessed encapsulation 1206 are connected to the silicon interposer 1212 with the microbumps 1230 to allow for less inductance in the transmission allowing higher frequency signal transmission. Mounted below the flexible circuit substrate 1202 are external interconnects, such as the solder ball interconnects 1220.

Figure 13:
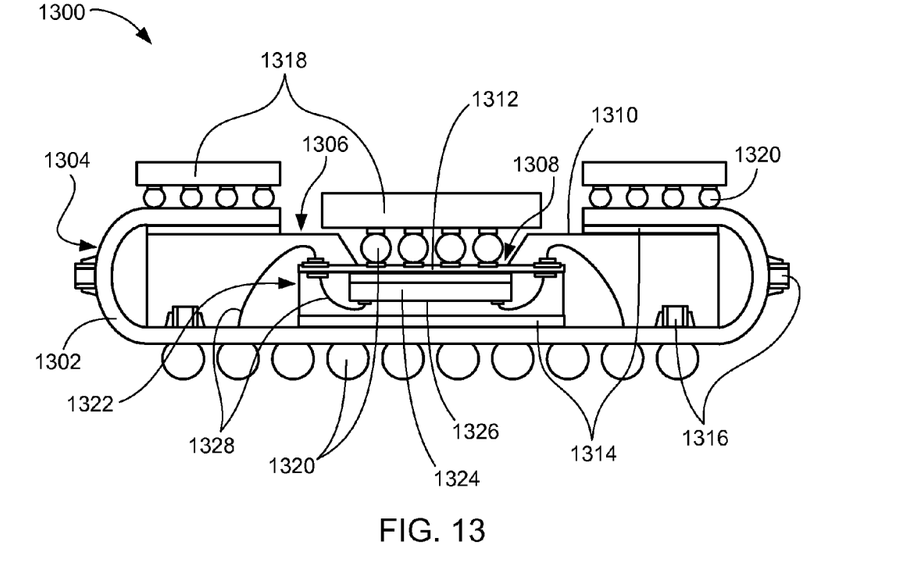
FIG. 13 is a cross-sectional view of an integrated circuit package system in accordance with a twelfth embodiment of the present invention.

Referring now to FIG. 13, therein is shown a cross-sectional view of an integrated circuit package system 1300 in accordance with a twelfth embodiment of the present invention. The integrated circuit package system 1300 is shown having a flexible circuit substrate 1302 with folds 1304. The flexible circuit substrate 1302 is folded around a recessed encapsulation 1306.

The flexible circuit substrate 1302 comprises at least one flexible insulating layer, such as: polyimide (PI), polyester, polyethylene napthalate (PEN), Teflon, polyethylene terephthalate (PET), or other polymeric materials.

The flexible circuit substrate 1302 also comprises at least one flexible conductive layer such as copper, aluminum, or metallic alloy. The flexible electrically conductive layer provides electrical connections between vias and various interconnects.

The recessed encapsulation 1306 has two distinct levels, such as a first level 1308 and a second level 1310. The second level 1310 is shown higher than the first level 1308 and at least partially surrounds the first level 1308.

The first level 1308 of the recessed encapsulation 1306 is shown having an inner stacking module (ISM) interposer 1312 such as a laminated plastic or ceramic substrate. The flexible circuit substrate 1302 is attached to the second level 1310 of the recessed encapsulation 1306 with a die attach adhesive 1314 and is sufficiently supported by the second level 1310.

The second level 1310 of the recessed encapsulation 1306 comprises passive components 1316 but may be replaced with a thin die or a low profile package. The passive components 1316 are also mounted on the folds 1304.

Mounted above the second level 1310 and above the first level 1308 of the recessed encapsulation 1306 are IC packages 1318. The IC packages 1318 may be replaced with a wafer level chip scale package (WLCSP), redistributed line (RDL) die, area array package, leadless package, leaded package, system-in-package (SiP), stacked die package, package-in-package (PiP), etc. The IC packages 1318 are mounted above the flexible circuit substrate 1302 and the second level 1310 of the recessed encapsulation 1306.

The IC packages 1318 above the second level 1310 are connected to the flexible circuit substrate 1302 with interconnects such as solder ball interconnects 1320 in a ball grid array (BGA) configuration. Beneath the first level 1308 of the recessed encapsulation 1306 an integrated circuit package such as an ISM 1322 with an integrated circuit such as a wire-bonded die 1324 having an active side 1326 is attached to the flexible circuit substrate 1302 with the die attach adhesive 1314.

The active side 1326 of the wire-bonded die 1324 is connected to the ISM interposer 1312 with interconnects such as bond wires 1328. The ISM interposer 1312 is connected from above to the flexible circuit substrate 1302 with the bond wires 1328.

The IC packages 1318 above the first level 1308 of the recessed encapsulation 1306 are mounted above the ISM interposer 1312 and connected to the ISM interposer 1312 with the solder ball interconnects 1320. Mounted below the flexible circuit substrate 1302 are external interconnects, such as the solder ball interconnects 1320.

Figure 14:
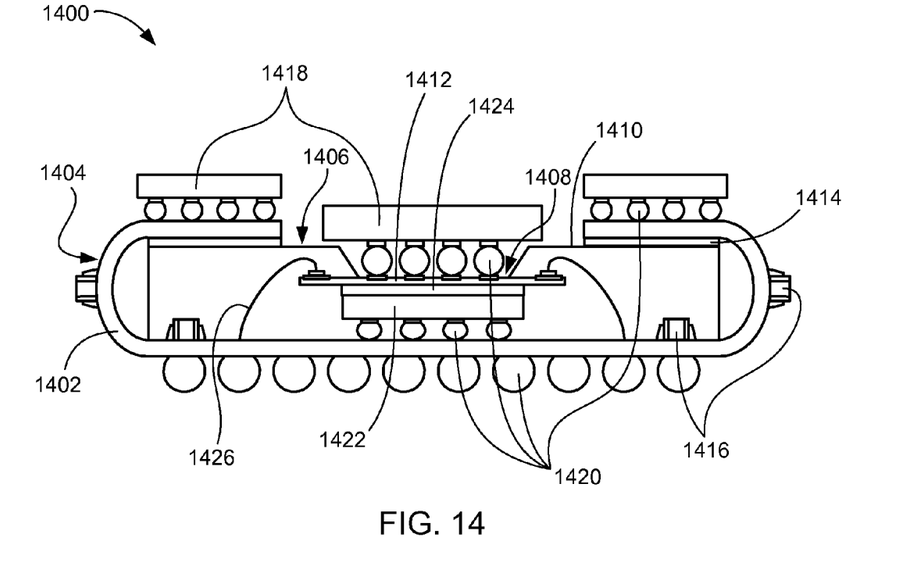
FIG. 14 is a cross-sectional view of an integrated circuit package system in accordance with a thirteenth embodiment of the present invention.

Referring now to FIG. 14, therein is shown a cross-sectional view of an integrated circuit package system 1400 in accordance with a thirteenth embodiment of the present invention. The integrated circuit package system 1400 is shown having a flexible circuit substrate 1402 with folds 1404. The flexible circuit substrate 1402 is folded around a recessed encapsulation 1406.

The flexible circuit substrate 1402 comprises at least one flexible insulating layer, such as: polyimide (PI), polyester, polyethylene napthalate (PEN), Teflon, polyethylene terephthalate (PET), or other polymeric materials.

The flexible circuit substrate 1402 also comprises at least one flexible conductive layer such as copper, aluminum, or metallic alloy. The flexible electrically conductive layer provides electrical connections between vias and various interconnects.

The recessed encapsulation 1406 has two distinct levels, such as a first level 1408 and a second level 1410. The second level 1410 is shown higher than the first level 1408 and at least partially surrounds the first level 1408.

The first level 1408 of the recessed encapsulation 1406 is shown having an interposer 1412 such as a laminated plastic or ceramic substrate. The flexible circuit substrate 1402 is attached to the second level 1410 of the recessed encapsulation 1406 with a die attach adhesive 1414 and is sufficiently supported by the second level 1410.

The second level 1410 of the recessed encapsulation 1406 comprises passive components 1416 but may be replaced with a thin die or a low profile package. The passive components 1416 are also mounted on the folds 1404.

Mounted above the second level 1410 and above the first level 1408 of the recessed encapsulation 1406 are IC packages 1418. The IC packages 1418 may be replaced with a wafer level chip scale package (WLCSP), redistributed line (RDL) die, area array package, leadless package, leaded package, system-in-package (SiP), stacked die package, package-in-package (PiP), etc.

The IC packages 1418 are mounted above the flexible circuit substrate 1402 and the second level 1410 of the recessed encapsulation 1406. The IC packages 1418 above the second level 1410 are connected to the flexible circuit substrate 1402 with interconnects such as solder ball interconnects 1420 in a ball grid array (BGA) configuration.

Beneath the first level 1408 of the recessed encapsulation 1406 an integrated circuit such as a flip-chip 1422 is connected to the flexible circuit substrate 1402 the solder ball interconnects 1420. Mounted above the flip-chip 1422 is an adhesive 1424. The interposer 1412 is mounted above the adhesive 1424 and connected from above to the flexible circuit substrate 1402 with interconnects such as bond wires 1426.

The IC packages 1418 above the first level 1408 of the recessed encapsulation 1406 are mounted above the interposer 1412 and connected to the interposer 1412 with the solder ball interconnects 1420. Mounted below the flexible circuit substrate 1402 are external interconnects, such as the solder ball interconnects 1420.

Figure 15:
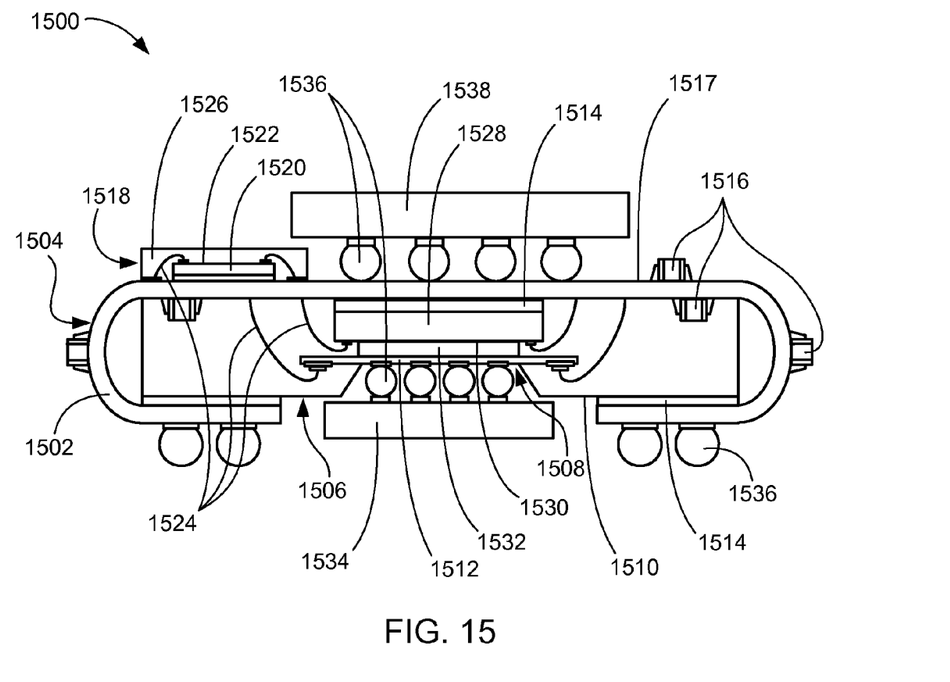
FIG. 15 is a cross-sectional view of an integrated circuit package system in accordance with a fourteenth embodiment of the present invention.

Referring now to FIG. 15, therein is shown a cross-sectional view of an integrated circuit package system 1500 in accordance with a fourteenth embodiment of the present invention. The integrated circuit package system 1500 is shown having a flexible circuit substrate 1502 with folds 1504. The flexible circuit substrate 1502 is folded around a recessed encapsulation 1506.

The recessed encapsulation 1506 is inverted as an example of various stacking options. The flexible circuit substrate 1502 comprises at least one flexible insulating layer, such as: polyimide (PI), polyester, polyethylene napthalate (PEN), Teflon, polyethylene terephthalate (PET), or other polymeric materials.

The flexible circuit substrate 1502 also comprises at least one flexible conductive layer such as copper, aluminum, or metallic alloy. The flexible electrically conductive layer provides electrical connections between vias and various interconnects.

The recessed encapsulation 1506 has two distinct levels, such as a first level 1508 and a second level 1510. The second level 1510 is shown higher than the first level 1508 and at least partially surrounds the first level 1508.

The first level 1508 of the recessed encapsulation 1506 is shown having an interposer 1512 such as a laminated plastic or ceramic substrate. The flexible circuit substrate 1502 is attached to the second level 1510 of the recessed encapsulation 1506 with a die attach adhesive 1514 and is sufficiently supported by the second level 1510.

The second level 1510 of the recessed encapsulation 1506 comprises passive components 1516 but may be replaced with a thin die or a low profile package. The passive components 1516 are also mounted on the folds 1504. The flexible circuit substrate 1502 has a base 1517.

Mounted above the second level 1510 of the recessed encapsulation 1506 and connected to the base 1517, are IC packages such as pre-molded IC packages 1518. The pre-mold IC packages 1518 may be replaced with a wafer level chip scale package (WLCSP), redistributed line (RDL) die, area array package, leadless package, leaded package, system-in-package (SiP), stacked die package, package-in-package (PiP), etc.

The pre-mold IC packages 1518 are mounted above the flexible circuit substrate 1502 and the second level 1510 of the recessed encapsulation 1506. The pre-mold IC packages 1518 are shown having a pre-mold wire-bonded die 1520 with an active side 1522.

The active side 1522 of the pre-mold wire-bonded die 1520 is connected to the flexible circuit substrate 1502 with interconnects such as bond wires 1524. The pre-mold IC packages 1518 have an encapsulation 1526 encapsulating the bond wires 1524 and the pre-mold wire-bonded die 1520.

Above the first level 1508 of the recessed encapsulation 1506 an integrated circuit such as a wire-bonded die 1528 with an active side 1530 is attached to the flexible circuit substrate 1502 with the die attach adhesive 1514.

The active side 1530 of the wire-bonded die 1528 is connected to the flexible circuit substrate 1502 with the bond wires 1524 and faces toward the first level 1508 of the recessed encapsulation 1506. Mounted below the wire-bonded die 1528 is a spacer 1532. The spacer 1532 should have a high thermal conductivity and may be an epoxy film or an adhesive tape.

The interposer 1512 is mounted below the spacer 1532 and connected from below to the flexible circuit substrate 1502 with the bond wires 1524. Below the first level 1508 a first IC package 1534 is mounted below the interposer 1512 and connected to the interposer 1512 with interconnects such as solder ball interconnects 1536.

Mounted above the first level 1508 of the recessed encapsulation 1506 and above the flexible circuit substrate 1502 is a second IC package 1538 connected to the base 1517 of the flexible circuit substrate 1502 with the solder ball interconnects 1536. Mounted below the flexible circuit substrate 1502 are external interconnects, such as the solder ball interconnects 1536.

Figure 16:
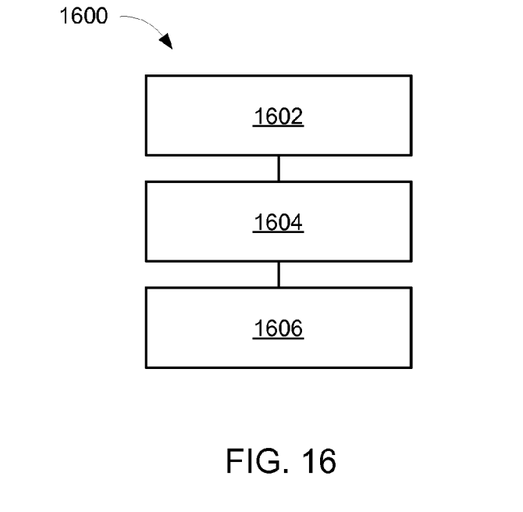
FIG. 16 is a flow chart of an integrated circuit package system for manufacture of an integrated circuit package system in an embodiment of the present invention.

Referring now to FIG. 16, therein is shown a flow chart of a system 1600 for the manufacture of the integrated circuit package system 100. The system 1600 includes: providing a flexible circuit substrate having a fold in a block 1602; mounting an integrated circuit or an integrated circuit package over the flexible circuit substrate and connected to the flexible circuit substrate with interconnects in a block 1604; and encapsulating the integrated circuit or integrated circuit package with a recessed encapsulation having a first level and a second level, the second level having the flexible circuit substrate folded thereover in a block 1606.

An aspect of the present invention is a package architecture that allows higher integration of devices with different functionality and yet minimizes the mounting space and overall thickness. This invention provides a flexible substrate, which has the extended portions wrapping around the outer edges of the molding compound of an exposed cavity for package stacking application on the folded portions of the flexible substrate and an interposer inside the exposed cavity.

Yet another important aspect of the present invention is that it valuably supports and services the historical trend of reducing costs, simplifying systems, and increasing performance.

These and other valuable aspects of the present invention consequently further the state of the technology to at least the next level.

Thus, it has been discovered that the integrated circuit package system of the present invention furnishes important and heretofore unknown and unavailable solutions, capabilities, and functional aspects for increasing functional integration while reducing the profile thickness and footprint area of a package. The resulting processes and configurations are straightforward, cost-effective, uncomplicated, highly versatile and effective, can be implemented by adapting known technologies, and are thus readily suited for efficiently and economically manufacturing integrated circuit package devices.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations, which fall within the scope of the included claims. All matters hithertofore set forth herein or shown in the accompanying drawings are to be interpreted in an illustrative and non-limiting sense.

What is claimed is:

1. A method of manufacturing of an integrated circuit package system comprising:
    providing a flexible circuit substrate having a fold;
    mounting an integrated circuit or an integrated circuit package over the flexible circuit substrate and connected to the flexible circuit substrate with interconnects; and
    encapsulating the integrated circuit or integrated circuit package with a recessed encapsulation having a first level and a second level, the second level having the flexible circuit substrate folded thereover.

2. The method as claimed in claim 1 wherein:
    providing the flexible circuit substrate includes providing a flexible circuit substrate with a base and mounting an integrated circuit package thereto.

3. The method as claimed in claim 1 wherein:
    mounting the integrated circuit includes mounting a wire-bonded die; and further comprising:
    mounting a spacer above the wire-bonded die; and
    mounting an interposer above the spacer.

4. The method as claimed in claim 1 further comprising:
    mounting passive components on a fold of the flexible circuit substrate, above the flexible circuit substrate, or on the base.

5. The method as claimed in claim 1 wherein:
    providing the flexible circuit substrate includes folding the flexible circuit substrate over the first level of the recessed encapsulation and over an integrated circuit package mounted to the first level of the recessed encapsulation.

6. A method of manufacturing of an integrated circuit package system comprising:
    providing a flexible circuit substrate having two folds;

mounting an integrated circuit or an integrated circuit package over the flexible circuit substrate and connected to the flexible circuit substrate with interconnects;
mounting passive components over the flexible circuit substrate;
encapsulating the integrated circuit or integrated circuit package within a recessed encapsulation under a first level and encapsulating the passive components under a second level, the second level having the flexible circuit substrate folded thereover; and
mounting a pre-mold integrated circuit or an integrated circuit package above the second level of the recessed encapsulation and connected to the flexible circuit substrate.

7. The method as claimed in claim 6 wherein:
mounting the integrated circuit or the integrated circuit package over the flexible circuit substrate includes mounting a wire-bonded die, or a flip chip, or a pre-mold package, or an inner stacking module over the flexible circuit substrate.

8. The method as claimed in claim 6 further comprising:
mounting a silicon interposer having through silicon vias and microbumps over the integrated circuit package and connected to the integrated circuit package with the microbumps.

9. The method as claimed in claim 6 further comprising:
mounting an integrated circuit package bridging the recessed encapsulation and connected to the flexible circuit substrate above the second level of the recessed encapsulation with solder ball interconnects.

10. The method as claimed in claim 6 wherein:
folding the flexible circuit substrate over the second level includes:
attaching the flexible circuit substrate to the second level with die attach adhesive; or
folding the flexible circuit substrate over the second level and over an integrated circuit package.

11. An integrated circuit package system comprising:
a flexible circuit substrate;
an integrated circuit or an integrated circuit package mounted over the flexible circuit substrate and connected to the flexible circuit substrate with interconnects; and
a recessed encapsulation encapsulating the integrated circuit or integrated circuit package having a first level and a second level, the second level having the flexible circuit substrate folded thereover.

12. The system as claimed in claim 11 wherein:
the flexible circuit substrate has a base and an integrated circuit package is mounted thereto.

13. The system as claimed in claim 11 wherein:
the integrated circuit is a wire-bonded die; and further comprising:
a spacer mounted above the wire-bonded die; and
an interposer mounted above the spacer.

14. The system as claimed in claim 11 further comprising:
passive components mounted on a fold of the flexible circuit substrate, above the flexible circuit substrate, or on the base.

15. The system as claimed in claim 11 wherein:
the flexible circuit substrate is folded over the first level of the recessed encapsulation and over an integrated circuit package mounted to the first level of the recessed encapsulation.

16. The system as claimed in claim 11 further comprising:
passive components mounted over the flexible circuit substrate;
a pre-mold integrated circuit, or an integrated circuit package mounted above the second level of the recessed encapsulation and connected to the flexible circuit substrate; and
wherein:
the integrated circuit or integrated circuit package is encapsulated within the recessed encapsulation under the first level and the passive components are encapsulated under the second level.

17. The system as claimed in claim 16 wherein:
the integrated circuit or the integrated circuit package is a wire-bonded die, or a flip chip, or a pre-mold package, or an inner stacking module mounted over the flexible circuit substrate.

18. The system as claimed in claim 16 further comprising:
a silicon interposer having through silicon vias and microbumps mounted over the integrated circuit package and connected to the integrated circuit package with the microbumps.

19. The system as claimed in claim 16 further comprising:
an integrated circuit package bridging the recessed encapsulation and connected to the flexible circuit substrate above the second level of the recessed encapsulation with solder ball interconnects.

20. The system as claimed in claim 16 wherein:
the flexible circuit substrate folded over the second level includes:
the flexible circuit substrate attached to the second level with die attach adhesive; or
the flexible circuit substrate folded over the second level and over an integrated circuit package.

* * * * *